United States Patent
Wilk et al.

(10) Patent No.: US 6,255,150 B1
(45) Date of Patent: Jul. 3, 2001

(54) USE OF CRYSTALLINE SIO$_x$ BARRIERS FOR SI-BASED RESONANT TUNNELING DIODES

(75) Inventors: Glen D. Wilk, Dallas; Berinder P. S. Brar, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/178,250

(22) Filed: Oct. 23, 1998

(51) Int. Cl.$^7$ .................... H01L 21/337; H01L 21/00; H01L 21/331; H01L 29/06; H01L 31/0328
(52) U.S. Cl. .................... 438/191; 438/47; 438/172; 438/264; 438/312; 257/9; 257/14; 257/25
(58) Field of Search .................... 257/335, 52, 104, 257/9, 14, 25; 438/644, 264, 187, 47, 172, 191, 312

(56) References Cited

U.S. PATENT DOCUMENTS

| | | | |
|---|---|---|---|
| 5,216,262 | * | 6/1993 | Tsu .................... 257/17 |
| 5,276,338 | * | 1/1994 | Beyer et al. .................... 257/52 |
| 5,422,305 | * | 6/1995 | Seabaugh et al. .................... 437/126 |
| 5,528,063 | * | 6/1996 | Blanchard .................... 257/335 |
| 5,646,070 | * | 7/1997 | Chung .................... 438/644 |
| 5,710,436 | * | 1/1998 | Tanamoto et al. .................... 257/14 |
| 5,849,370 | * | 12/1998 | Lee et al. .................... 427/562 |
| 6,069,368 | * | 5/2000 | Wilk et al. .................... 257/25 |

OTHER PUBLICATIONS

Hacke et al, MBE growth and characterization of buried silicon oxide films on Si(100), 280 Thin Solid Films 107–111 (1996).

T. Maloney, MBE growth and characterization of single crystal silicon oxides on (111) and (100) silicon, 1 JVST B 773 (1983).

* cited by examiner

Primary Examiner—Matthew Smith
Assistant Examiner—Lex H. Malsawma
(74) Attorney, Agent, or Firm—Carlton H. Hoel; W. James Brady; Frederick J. Telecky, Jr.

(57) ABSTRACT

A method of forming a crystalline silicon well over a silicon oxide barrier layer, preferably for use in formation of a tunneling diode. A silicon substrate is provided of predetermined crystallographic orientation. A layer of crystallographic silicon oxide is formed over the silicon substrate and substantially matched to the crystallographic orientation of the silicon substrate. A layer of crystallographic silicon is formed over the silicon oxide layer substantially matched to the crystallographic orientation of the silicon oxide layer. The layer of silicon oxide is formed by the steps of placing the silicon substrate in a chamber having an oxygen ambient and heating the substrate to a temperature in the range of from about 650 to about 750 degrees C. at a pressure of from about $10^{-4}$ to about $10^{-7}$ until the silicon oxide layer has reached a predetermined thickness. In the case of a tunneling diode, the layer of silicon oxide has a thickness of from about 2 to about 8 monolayers and the layer of crystallographic silicon has a thickness of from about 2 to about 8 monolayers. A second layer of silicon oxide is provided on the layer of silicon remote from the layer of crystallographic silicon oxide. In the case of a silicon-on-insulator-type structure, the layer of crystallographic silicon oxide is from about 500 to about 2000 Angstroms and preferably 1000 Angstroms and the layer of silicon is from about 50 to about 1000 Angstroms and preferably 100 Angstroms.

12 Claims, 1 Drawing Sheet

USE OF CRYSTALLINE $SiO_x$ BARRIERS FOR SI-BASED RESONANT TUNNELING DIODES

GOVERNMENT CONTRACTS

This invention was developed during work on DARPA contract No. F49620-96-C-0006.

BACKGROUND OF THE INVENTION

1. Field of the Invention

This invention relates to the formation of crystalline silicon oxide barriers for use in semiconductor devices with particular but not sole use in connection with silicon-based resonant tunneling diodes.

2. Brief Description of the Prior Art

Resonant tunneling diodes are typically devices which are built on a semiconductor substrate, generally having (100) crystallographic orientation. The silicon-based diode structure generally includes a thin barrier layer of silicon oxide over the substrate onto which is deposited a layer of silicon. A further barrier layer of silicon oxide is deposited over the silicon layer with a gate electrode, which is a metal of doped polysilicon, formed thereover to complete the diode structure. According to the I-V (current vs. voltage) curve of such diodes), at a low voltage (below about 1 volt) across the diode as shown in FIG. 1 at voltage $V_1$ in the current flow observed at voltages closely below and closely above voltage $V_1$, this voltage rapidly tapering off at voltage $V_2$ and then rising exponentially starting at voltage $V_3$. This phenomenon occurs because current flow generally does not occur until the current is able to go over the energy barrier of the barrier layer of the tunneling diode. However, if the barrier layer is sufficiently thin, such as from about 2 to about 8 monolayers or from about 6 to about 25 Angstroms (this distance depending upon the barrier layer molecules involved), then electrons can tunnel through the barrier. Furthermore, if the silicon well is sufficiently thin, i.e. from about 2 to about 8 monolayers and preferably about 5 monolayers or about 15 Angstroms, quantum levels are set up within the quantum well. Accordingly, if the voltage is tuned properly, the electron energy will align with one of the quantum states and travel through the quantum well as well as the barriers. However, if the voltage is such that the electron energy is not aligned with a quantum state (e.g. $<V_1$ volts) and has no quantum state in which to tunnel, the current flow drops until the energy level is sufficient to go over the barrier or until a higher quantum state, if present, has been reached. This explains the sudden peak in current flow at about $V_1$ volts as discussed above and shown in FIG. 1. It follows that with sufficiently thin layers, tunneling is obtained to provide high current flow with low voltage levels. This is an important attribute in view of the present direction of the art toward the use of lower voltage components.

A key to the operation described above is that the well must by crystalline. This has not presented a problem in the prior art devices which are based upon group III–V compounds, such as gallium arsenide, because, for example, an epitaxially deposited aluminum gallium arsenide insulator layer can be formed over, for example, crystalline gallium arsenide. Crystalline gallium arsenide is a semiconductor with sufficiently close crystallographic lattice structure match to the aluminum gallium arsenide insulator such that the deposited insulator is also crystalline. This arrangement is not available using a silicon semiconductor well and using prior art techniques. The reason is that, in the fabrication of a silicon-based tunneling device, though starting with a crystalline (100) silicon substrate, the first barrier layer of silicon dioxide formed thereon by standard processing techniques cannot sustain a crystalline silicon layer thereover. Accordingly, the silicon dioxide layer over the crystalline substrate is amorphous, resulting in a silicon well which is also amorphous. It follows that the fabrication of silicon-based resonant tunneling diodes (RTDs) requires a high quality, crystalline quantum well surrounded by ultrathin barriers, which provide a suitable offset in the conduction band from the substrate and insulating barriers. Many materials can provide a large conduction band offset, however most of these materials yield a poor quality silicon quantum well. The ability to grow epitaxial, silicon lattice-matched insulators directly on silicon would allow fabrication of high quality silicon quantum wells for RTD and other applications.

SUMMARY OF THE INVENTION

In accordance with the present invention, there is provided a method whereby high quality quantum wells can be fabricated for RTDs and other applications. The method involves growth of lattice-matched electrically insulating films directly on Si (100) which do not react with the silicon substrate or the silicon quantum well. This allows growth of a single crystal silicon quantum well and extremely sharp interfaces between the electrically insulating layers and the quantum well. This is essential for high performance RTDs. Other methods involve insulating materials which react with the surrounding silicon and which yield defective, polycrystalline silicon quantum wells.

The method in accordance with the present invention uses only silicon-based materials for both the electrically insulating barriers and the quantum well, therefore providing excellent compatibility for fabrication. Since the silicon oxide layer can be deposited in a crystalline form with excellent lattice-matching to the substrate, a high quality silicon quantum well can be grown with a sharp interface and without a reaction layer forming at the interface. The silicon suboxide ($SiO_x$) layer can also be grown epitaxially and, since it wets the silicon surface, this eliminates film uniformity problems. This approach therefore avoids the problems with most other methods because there is no concern for interface reaction and film uniformity of the electrically insulating barrier on the substrate.

The ability to deposit an electrically insulating, lattice matched material directly on Si (100) allows for high quality overgrowth of a silicon quantum well. By depositing a silicon suboxide ($SiO_x$) layer with $0<x<2$ on the silicon substrate under appropriate conditions, the suboxide layer is crystalline and semi-insulating. Using an electron beam evaporator source for silicon deposition and a backfilled oxygen ambient in the deposition chamber, a range of oxygen partial pressures and substrate temperatures can be used to obtain high quality $SiO_x$ layers on silicon. For substrate temperatures ranging from about 650 to about 750 degrees C. and oxygen partial pressures ranging from about $10^{-7}$ to about $10^{-4}$ Torr as shown in FIG. 3, oxygen concentrations from about ten atomic percent (sum of oxygen atoms divided by sum of oxygen and silicon atoms) up to about 40 atomic percent in the $SiO_x$ films have been observed with excellent crystalline quality when crystalline silicon is placed in an oxygen ambient under the above described conditions of temperature and pressure. Lower temperatures and higher oxygen pressures result in higher oxygen concentrations while higher temperatures and lower oxygen pressures result in lower oxygen contents. Inert gases, such as argon or helium, can be used with oxygen, but there is no advantage if silicon is evaporated. For CVD techniques, allowing for carrier gases such as nitrogen, $SiH_4$, $Si_2H_6$, $Si_2Cl_2H_2$ are useful. Only the partial pressure of oxygen matters for obtaining crystalline suboxide ($SiO_x$ layer where $0<x<2$). Electrical properties of individual suboxide films indicate that they are semi-insulating with resistivities of about $10^4$ ohm-cm and conduction band offsets of about 0.5 eV. The electrical resistivity and barrier height both increase with increasing oxygen content. Therefore, in general, higher oxygen contents are desirable since these properties are tunable with oxygen content, however, there may be some applications where specific, lower resistivities and barrier heights are desirable.

In the above described manner, the suboxide film is a barrier with a conduction band offset and a crystalline silicon quantum well can be deposited over this $SiO_x$ layer to form a high quality crystalline silicon quantum well with sharp, well defined interfaces which are necessary for electron coherence in transport for the RTD operation. Once the silicon quantum well has been deposited on the crystalline $SiO_x$ film, the process can be repeated so that a second $SiO_x$ film is grown over the silicon well. Alternatively, since the crystalline quality of the second barrier is not critical, an amorphous silicon dioxide layer can also be grown as the second barrier over the silicon well by standard thermal or ultraviolet ozone techniques. This approach avoids the need for introduction of other lattice-matched materials (such as $CaF_2$) which create additional problems. As a further example, a structure is provided which is similar to the well known silicon on insulator (SOI) structures wherein the starting material is again a substrate of silicon (100) over which is formed a layer of crystalline silicon suboxide in the same manner as described above except that this layer will be much thicker than in the case of the tunneling diode, generally from about 500 to about 2000 Angstroms and preferably about 1000 Angstroms, this thickness being widely variable. A layer of crystalline silicon having a thickness of from about 50 to about 1000 and preferably about 100 Angstroms is then deposited over the silicon suboxide in standard manner to complete the SOI-type structure.

DESCRIPTION OF THE PREFERRED EMBODIMENT

Figure 1:
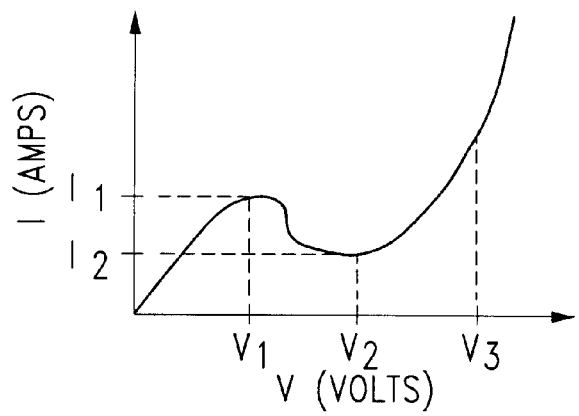
FIG. 1 is a characteristic I-V curve of an RTD in accordance with the present invention.
Figure 2:
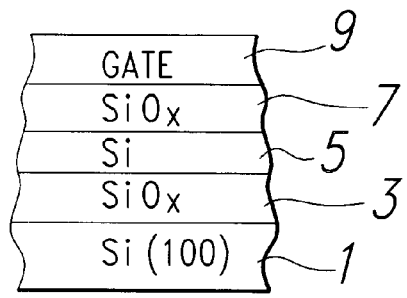
FIG. 2 is a schematic diagram of a silicon-based resonant tunneling diode in accordance with the present invention.

To provide a resonant silicon-based tunneling diode in accordance with the present invention and with reference to FIG. 2, there is initially provided a substrate of silicon 1 having (100) crystallographic orientation. The substrate 1 is placed in a chamber and a crystalline layer of silicon suboxide 3 as defined above is formed over the crystalline silicon by filling the chamber with oxygen at a temperature of 700 degrees C. and at a pressure of $10^{-5}$ Torr at a silicon deposition create of 2 Angstroms/second for a period of time to provide a layer of silicon suboxide of 15 Angstroms. The crystalline silicon suboxide will form whenever the pressure and temperature of the substrate in the oxygen ambient is in the range shown by the box 11 in FIG. 3 as discussed above, with etching of the silicon with a resulting rough silicon surface taking place at higher temperatures and lower oxygen partial pressures outside of the box and standard amorphous silicon dioxide be formed at lower temperatures and higher oxygen partial pressures outside of the box. If a thin layer of silicon dioxide resides on the crystallographic silicon, oxygenation in the temperature range from about 650 to about 750 degrees C. at a pressure of from about $10^{-4}$ to about $10^{-7}$ Torr will cause initial removal of the silicon dioxide before formation of the crystalline silicon suboxide. A 15 Angstrom layer of silicon 5 is then epitaxially deposited over the crystalline silicon suboxide 3, this layer being crystalline in form since the layer 3 thereunder is crystalline. A further layer of silicon oxide 7, either dioxide (amorphous) or suboxide (crystalline), is formed over the silicon layer 5 either by standard silicon dioxide formation techniques, preferably chemical vapor deposition (CVD) or by a repeat of the procedure used to form the silicon suboxide layer 3. A metal gate 9 is then deposited over the silicon oxide layer 7 to complete formation of the diode.

Figure 3:
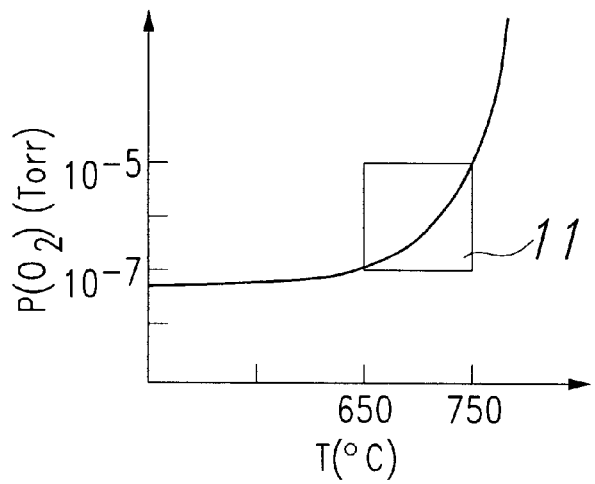
FIG. 3 is a graph showing the temperature and pressure window used for formation of crystalline silicon suboxide in accordance with the present invention.
Figure 4:
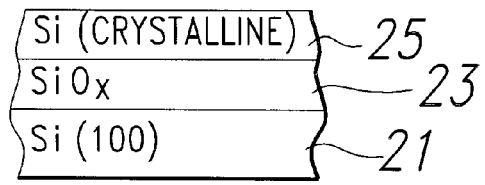
FIG. 4 is a schematic of a silicon-on-insulator (SOI) type of structure formed in accordance with the present invention.

As a further example, a structure can be devised which is similar to the well known silicon on insulator (SOI) structures as shown in FIG. 3 wherein the starting material is again a substrate of silicon (100) 21 over which is formed a layer of crystalline silicon suboxide 23 in the same manner as described above except that this layer will be much thicker than in the case of the tunneling diode, generally about 1000 Angstroms, though this thickness can vary widely. A layer of crystalline silicon 23 having a thickness of about 100 Angstroms is then deposited over the silicon suboxide 23 in standard manner to complete the structure.

Though the invention has been described with reference to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. A method of forming a silicon well over a silicon oxide barrier layer which comprises the steps of:

(a) providing a silicon substrate of predetermined crystallographic orientation;

(b) forming a layer of crystallographic silicon oxide over said silicon substrate and substantially matched to the crystallographic orientation of said silicon substrate, said silicon oxide layer of thickness for carrier quantum tunneling and of composition with 10–40 atomic percent oxygen; and (c) forming a layer of crystallographic silicon over said silicon oxide layer substantially matched to the crystallographic orientation of said silicon oxide layer.

2. The method of claim 1 wherein said layer of silicon oxide is formed by the steps of placing said silicon substrate in a chamber having an oxygen ambient and heating said substrate to a temperature in the range of from about 650 to about 750 degrees C. at a partial pressure of from about $10^{-4}$ to about $10^{-7}$ Torr until said silicon oxide layer has reached a predetermined thickness.

3. The method of claim 2 wherein said layer of silicon oxide has a thickness of from about 2 to about 8 monolayers.

4. The method of claim 3 wherein said layer of crystallographic silicon has a thickness of from about 2 to about 8 monolayers.

5. The method of claim 4 further including a second layer of silicon oxide on said layer of silicon remote from said layer of crystallographic silicon oxide.

6. The method of claim 2 wherein said layer of crystallographic silicon has a thickness of from about 2 to about 8 monolayers.

7. The method of claim 6 further including a second layer of silicon oxide on said layer of silicon remote from said layer of crystallographic silicon oxide.

8. The method of claim 1 wherein said layer of silicon oxide has a thickness of from about 2 to about 8 monolayers.

9. The method of claim 8 wherein said layer of crystallographic silicon has a thickness of from about 2 to about 8 monolayers.

10. The method of claim 9 further including a second layer of silicon oxide on said layer of silicon remote from said layer of crystallographic silicon oxide.

11. The method of claim 1 wherein said layer of crystallographic silicon has a thickness of from about 2 to about 8 monolayers.

12. The method of claim 11 further including a second layer of silicon oxide on said layer of silicon remote from said layer of crystallographic silicon oxide.

* * * * *

UNITED STATES PATENT AND TRADEMARK OFFICE
CERTIFICATE OF CORRECTION

PATENT NO.    : 6,255,150 B1  
DATED         : July 3, 2001  
INVENTOR(S)   : Glen D. Wilk and Berinder P.S. Brar It is certified that error appears in the above-identified patent and that said Letters Patent is hereby corrected as shown below:

<u>Title page,</u>
Insert Item: -- Related U.S. Application Data

[60] Provisional Application No. 60/063,224 filed 10/23/1997. --

Signed and Sealed this

Eleventh Day of March, 2003

JAMES E. ROGAN
*Director of the United States Patent and Trademark Office*